(12) United States Patent
Liang et al.

(10) Patent No.: US 10,380,401 B2
(45) Date of Patent: Aug. 13, 2019

(54) CAPACITANCE SENSING CIRCUIT AND FINGERPRINT IDENTIFICATION SYSTEM

(71) Applicant: Shenzhen Goodix Technology Co., Ltd., Shenzhen, Guangdong (CN)

(72) Inventors: Yu-An Liang, Taipei (TW); Meng-Ta Yang, Taipei (TW)

(73) Assignee: Shenzhen Goodix Technology Co., Ltd., Shenzhen, Guangdong (CN)

( * ) Notice: Subject to any disclaimer, the term of this patent is extended or adjusted under 35 U.S.C. 154(b) by 103 days.

(21) Appl. No.: 15/841,328

(22) Filed: Dec. 14, 2017

(65) Prior Publication Data

US 2018/0144171 A1    May 24, 2018

Related U.S. Application Data

(63) Continuation of application No. PCT/CN2016/106826, filed on Nov. 22, 2016.

(51) Int. Cl.

| | |
|---|---|
| *G06K 9/00* | (2006.01) |
| *H03K 17/96* | (2006.01) |
| *G06F 3/041* | (2006.01) |
| *H03M 1/66* | (2006.01) |
| *G11C 27/02* | (2006.01) |
| *H03M 1/46* | (2006.01) |
| *G06F 3/044* | (2006.01) |

(52) U.S. Cl.
CPC ......... *G06K 9/0002* (2013.01); *G06F 3/0416* (2013.01); *G11C 27/024* (2013.01); *H03K 17/962* (2013.01); *H03K 17/9622* (2013.01); *H03M 1/466* (2013.01); *H03M 1/66* (2013.01); *G06F 3/044* (2013.01); *H03K 2217/96074* (2013.01); *H03K 2217/960725* (2013.01)

(58) Field of Classification Search
CPC ...... G06K 9/0002; H03M 1/466; H03M 1/66; H03K 17/9622; H03K 17/962; H03K 2217/960725; H03K 2217/96074; G06F 3/0416; G06F 3/044; G11C 27/024
USPC .......................................................... 382/124
See application file for complete search history.

(56) References Cited

U.S. PATENT DOCUMENTS

2010/0327962 A1* 12/2010 Lee ........................ H03M 1/745
                                                327/540
2012/0274340 A1   11/2012 Yang
(Continued)

FOREIGN PATENT DOCUMENTS

| CN | 101738544 A | 6/2010 |
|---|---|---|
| CN | 102109938 A | 6/2011 |

(Continued)

*Primary Examiner* — Amandeep Saini
(74) *Attorney, Agent, or Firm* — Winston Hsu

(57) ABSTRACT

The present application provides a capacitance sensing circuit, comprising an integrating circuit, comprising an integrating input terminal, coupled to the touch capacitance, wherein the integrating input terminal receives an input voltage; and an integrating output terminal, configured to output an output voltage; a comparator; a positive digital-to-analog (DA) converting unit; a negative DA converting unit; a control circuit, configured to control the positive DA converting unit and the negative DA converting unit; and a logic circuit, configured to output an output code, wherein the output code is related to a capacitance of the touch capacitance.

18 Claims, 4 Drawing Sheets

(56) References Cited

U.S. PATENT DOCUMENTS

| | | |
|---|---|---|
| 2013/0038476 A1 | 2/2013 | Pedersen |
| 2013/0169340 A1 | 7/2013 | Tao |
| 2013/0314342 A1* | 11/2013 | Kim ........................ G06F 3/041 |
| | | 345/173 |
| 2014/0176482 A1 | 6/2014 | Wei |
| 2014/0266258 A1 | 9/2014 | Yang |

FOREIGN PATENT DOCUMENTS

| | | |
|---|---|---|
| CN | 102313566 A | 1/2012 |
| CN | 102954753 A | 3/2013 |
| KR | 10-2016-0061502 A | 6/2016 |
| KR | 10-2018-0048446 A | 5/2018 |
| WO | 2016115422 A1 | 7/2016 |

* cited by examiner

CAPACITANCE SENSING CIRCUIT AND FINGERPRINT IDENTIFICATION SYSTEM

CROSS REFERENCE TO RELATED APPLICATIONS

The present application is a continuation of international application No. PCT/CN2016/106826, filed on Nov. 22, 2016, of which are incorporated herein by reference in its entirety.

FIELD OF THE INVENTION

The present application relates to a circuit, and more particularly, to a capacitance sensing circuit and a fingerprint identification generating digital output.

BACKGROUND

With the development of technology, mobile phones, digital cameras, tablet PCs, notebook computers and other portable electronic devices become more and more popular. The portable electronic devices are intended for personal use, with certain privacy. The information stored in the portable device such as phonebook, photos, personal information, etc., are privately owned. If the electronic device is lost, these data may be accessed by other people, causing unnecessary loss. Even though there are several ways using password to protect the electronic device from being used by the other people, the password may be easily to be spread or cracked, which lowers the security. Moreover, the user needs to remember the password so as to use electronic devices. If the user forgets the password, troubles would be brought to the user. Hence, personal fingerprint identification is utilized to achieve the purpose of personal identification, for enhancing the data security.

In general, the fingerprint identification system uses a capacitance sensing circuit to receive a touch of a finger. The capacitance sensing circuit is configured to receive the touch of the finger and forms a touch capacitance with the finger. The capacitance sensing circuit may convert the capacitance of the touch capacitance as an analog voltage signal. The analog voltage signal should be converted into digital voltage signals, and sent to the fingerprint identification module in the backend to determine whether the capacitance sensing circuit corresponds to a finger ridge or a finger valley of the finger. In other words, the analog voltage signal should be delivered to an analog-to-digital convertor (ADC) to be converted into digital signals. However, the ADC has high circuit complexity, occupies large circuit area, raises production cost, and consumes more power.

SUMMARY

It is therefore a primary objective of the present application to provide a capacitance sensing circuit and a fingerprint identification system with simple circuit.

To solved the problem stated in the above, the present application provides a capacitance sensing circuit, configured to sense a touch capacitance, comprising an integrating circuit, comprising an integrating input terminal, coupled to the touch capacitance, wherein the integrating input terminal receives an input voltage; and an integrating output terminal, configured to output an output voltage; a comparator, comprising a first input terminal, coupled to the integrating output terminal; and a second input terminal, configured to receive a reference voltage; a positive digital-to-analog (DA) converting unit, coupled to the integrating input terminal; a negative DA converting unit, coupled to the integrating input terminal; a control circuit, coupled to a comparing output terminal of the comparator, configured to control the positive DA converting unit and the negative DA converting unit; and a logic circuit, coupled to the comparing output terminal, configured to generate a first code within an integrating interval and generate a second code within a comparing interval, the logic circuit output an output code according to the first code and the second code, where the output code is related to a capacitance of the touch capacitance.

For example, the positive DA converting unit comprises the plurality of positive DA converting capacitors, coupled to the integrating input terminal; a plurality of first DA converting switches, wherein a terminal of each first DA converting switch is coupled to the plurality of positive DA converting capacitors, and the other terminal of each first DA converting switch is configured to receive a positive voltage; and a plurality of second DA converting switches, wherein a terminal of each second DA converting switch is coupled to the plurality of positive DA converting capacitors and the other terminal of each second DA converting switch is coupled to a ground terminal; the negative DA converting unit comprises the plurality of negative DA converting capacitors, coupled to the integrating input terminal; a plurality of third DA converting switches, wherein a terminal of each third DA converting switch is coupled to the plurality of negative DA converting capacitors, and the other terminal of each third DA converting switch receives the positive voltage; and a plurality of fourth DA converting switches, wherein a terminal of each fourth DA converting switch is coupled to the plurality of negative DA converting capacitors, and the other terminal of each fourth DA converting switch is coupled to the ground terminal; wherein the plurality of first DA converting switches, the plurality of second DA converting switches, the plurality of third DA converting switches and the plurality of fourth DA converting switches are controlled by the control circuit.

For example, capacitances of the plurality of positive DA converting capacitors have an exponential relationship in between, and capacitances of the plurality of negative DA converting capacitors have an exponential relationship in between.

For example, the control circuit controls the first DA converting switches and the second DA converting switches of the positive DA converting unit in the integrating interval, such that when the comparator transition happens, the output voltage is added by a first specific value.

For example, the logic circuit counts transition times of the comparator in the integrating interval, and generated the first code related to the accumulated transition count.

For example, the control circuit controls the first DA converting switches and the second DA converting switches of the positive DA converting unit in a sampling interval, such that the plurality of positive DA converting capacitors receives the positive voltage; and the control circuit controls the third DA converting switches and the fourth DA converting switches of the negative DA converting unit in the sampling interval, such that the plurality of negative DA converting capacitors are coupled to the ground terminal.

For example, the control circuit controls the plurality of first DA converting switches, the plurality of second DA converting switches, the plurality of third DA converting switches and the plurality of fourth DA converting switches in the comparing interval, so as to adjust the input voltage.

For example, the comparing interval comprises a plurality of comparing subintervals, and within one of the plurality of comparing subintervals, the comparator generates a comparing result corresponding to the comparing subinterval.

For example, the logic circuit generates the second code according to a plurality of comparing results corresponding to the plurality of comparing subintervals.

For example, in the comparing subinterval, when the comparing result indicates that the input voltage is greater than a common mode voltage, the control circuit controls the plurality of first DA converting switches, the plurality of second DA converting switches, the plurality of third DA converting switches and the plurality of fourth DA converting switches, such that the input voltage is decreased by a second specific value in the next comparing subinterval.

For example, in the comparing subinterval, when the comparing result indicates that the input voltage is less than a common mode voltage, the control circuit controls the plurality of first DA converting switches, the plurality of second DA converting switches, the plurality of third DA converting switches and the plurality of fourth DA converting switches, such that the input voltage is increased by a third specific value in the next comparing subinterval.

For example, the output code is the second code plus the shifted first code shifted left by (N−1) bits, and N represents number of bits within the second code.

For example, the capacitance sensing circuit further comprises a sample-and-hold circuit, coupled to the touch capacitance and the integrating input terminal.

For example, the sample-and-hold circuit comprises a first switch, wherein a terminal of the first switch receives a positive voltage, and the other terminal of the first switch is coupled to the touch capacitance; and a second switch, wherein a terminal of the second switch is coupled to the touch capacitance, and the other terminal of the second switch is coupled to the integrating input terminal; wherein the first switch is conducted and the second switch is cutoff within a first time, while the first switch is cutoff and the second switch is conducted within a second time.

For example, the integrating circuit comprises an amplifier, coupled between the integrating input terminal and the integrating output terminal; an integrating capacitor, coupled to the integrating input terminal; a third switch, coupled to the integrating capacitor and the integrating output terminal; and a fourth switch, wherein a terminal of the fourth switch is coupled to the integrating capacitor and the third switch, and the other terminal of the fourth switch receives a common mode voltage.

For example, the reference voltage is equal to the common mode voltage.

For example, the integrating circuit further comprises a fifth switch, coupled between the integrating input terminal and the integrating output terminal.

The present application further provides a fingerprint identification system, comprising a plurality of pixel circuits, configured to form a plurality of touch capacitances with a finger; a capacitance sensing circuit, coupled to the plurality of pixel circuits, configured to sense the plurality of touch capacitances, the capacitance sensing circuit comprising an integrating circuit, comprising an integrating input terminal, wherein the integrating input terminal is configured to receive an input voltage; and an integrating output terminal, configured to output an output voltage; a comparator, comprising a first input terminal, coupled to the integrating output terminal; and a second input terminal, configured to receive a reference voltage; a positive DA converting unit, coupled to the integrating input terminal; a negative DA converting unit, coupled to the integrating input terminal; a control circuit, coupled to a comparing output terminal of the comparator, configured to control the positive DA converting unit and the negative DA converting unit; and a logic circuit, coupled to the comparing output terminal, configured to generate a first code within an integrating interval and generate a second code within a comparing interval, wherein the logic circuit outputs an output code according to the first code and the second code, and the output code is related to a capacitance of a touch capacitance of the plurality of touch capacitances.

The capacitance sensing circuit provided by the present application may convert the capacitance of the touch capacitance into a digital signal, which has the advantages of simple circuit, small circuit area, low cost, low power consumption and low latency.

These and other objectives of the present invention will no doubt become obvious to those of ordinary skill in the art after reading the following detailed description of the preferred embodiment that is illustrated in the various figures and drawings.

DETAILED DESCRIPTION

In order to make the objects, technical solutions and advantages of the present invention become more apparent, the following relies on the accompanying drawings and embodiments to describe the present invention in further detail. It should be understood that the specific embodiments described herein are only for explaining the present invention and are not intended to limit the present invention.

The capacitance sensing circuit of the present application is configured to sense a touch capacitance, which may directly output the output code related to the capacitance, without using analog-to-digital converter (ADC) in the backend to convert the analog signal related to the capacitance into the output code. Specifically, please refer to FIG. 1, which is a schematic diagram of a capacitance sensing circuit 10 according to an embodiment of the present application. The capacitance sensing circuit 10 is configured to sense a touch capacitance Cf. The capacitance sensing circuit 10 may directly output an output code $c_{totoal}$ related to a capacitance of the touch capacitance Cf.

Figure 1:
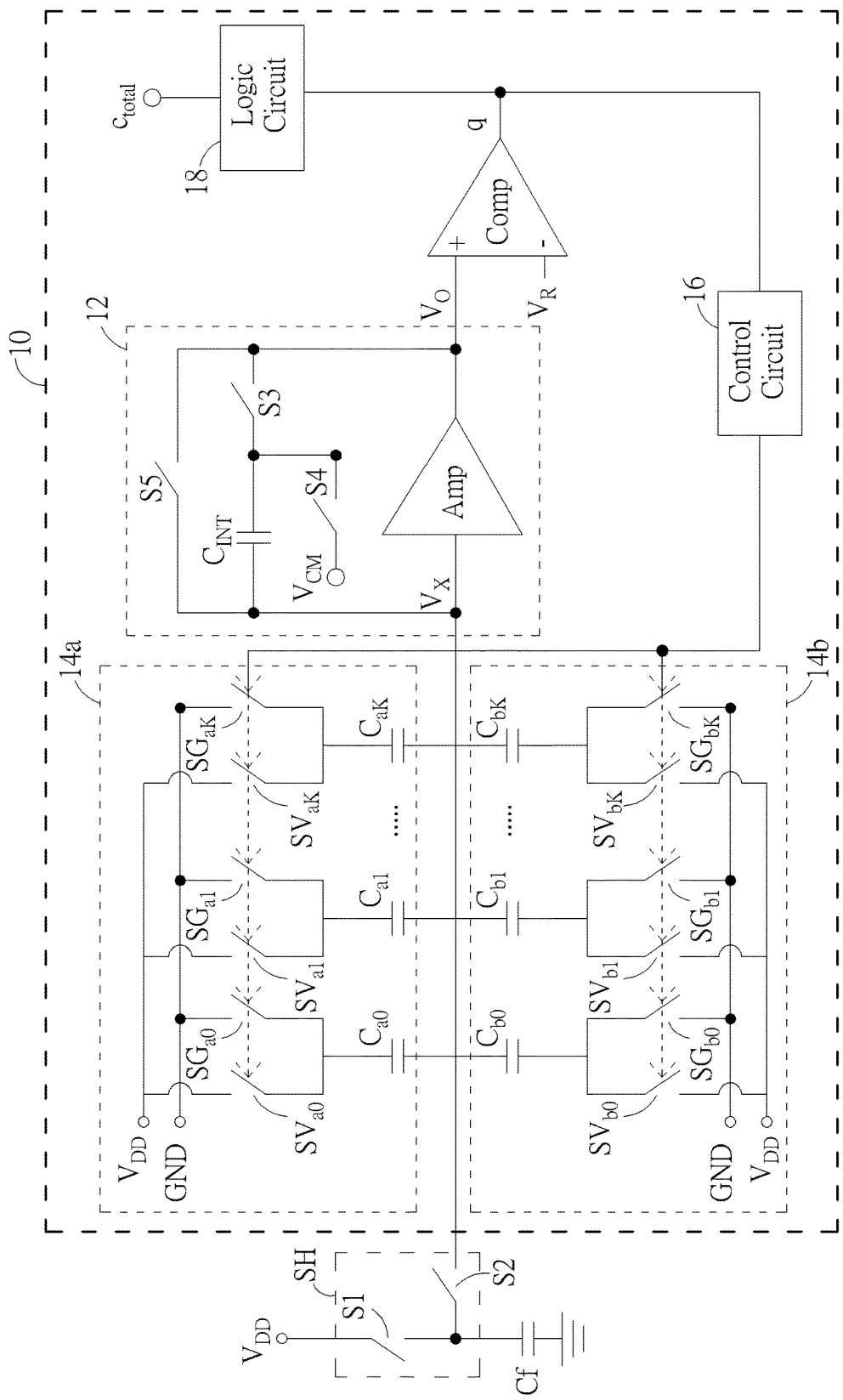
FIG. 1 is a schematic diagram of a capacitance sensing circuit according to an embodiment of the present application.

As shown in FIG. 1, the capacitance sensing circuit 10, coupled to a sample-and-hold circuit SH, comprises an integrating circuit 12, a comparator Comp, a positive digital-to-analog (DA) converting unit 14a, a negative DA converting unit 14b, a control circuit 16 and a logic circuit 18. The integrating circuit 12 comprises an integrating input terminal and an integrating output terminal. At the integrating input terminal, an input voltage Vx is formed. The integrating output terminal outputs an output voltage Vo. The sampleand-hold circuit SH comprises switches S1 and S2. A terminal of the switch S1 receives a positive voltage $V_{DD}$, and the other terminal of the switch S1 is coupled to the touch capacitance Cf. A terminal of the switch S2 is coupled to the touch capacitance Cf, and the other terminal of the switch S2 is coupled to the integrating input terminal. The integrating circuit 12 comprises an amplifier Amp, an integrating capacitor $C_{INT}$ and switches S3, S4 and S5. The amplifier Amp, the integrating capacitor $C_{INT}$ and the switches S3, S5 are coupled between the integrating input terminal and the integrating output terminal of the integrating circuit 12. Specifically, the integrating capacitor $C_{INT}$ and the switch S3 are connected in a series, and the switch S5 is connected with the series in parallel. A terminal of the switch S4 is coupled to the integrating capacitor $C_{INT}$ and the switch S3, and the other terminal of the switch S4 receives a common mode voltage $V_{CM}$. A first input terminal of the comparator Comp is coupled to the integrating output terminal to receive the output voltage Vo, and a second input terminal of the comparator Comp receives a reference voltage $V_R$. The comparator Comp generates a comparing result q of the output voltage Vo and the reference voltage $V_R$ and outputs the comparing result q to a comparing output terminal of the comparator Comp. The control circuit 16, coupled to the comparing output terminal of the comparator Comp, is configured to generate a plurality of control signals to control the positive DA converting unit 14a and the negative DA converting unit 14b. The logic circuit 18, coupled to the comparing output terminal of the comparator Comp, is configured to generate a first code $c_1$ in an integrating interval and generate a second code $c_2$ in a comparing interval $T_{CP}$. The logic circuit 18 may generate the output code $c_{totoal}$ related to the capacitance of the touch capacitance Cf according to the first code $c_1$ and the second code $c_2$, where the first code $c_1$, the second code $c_2$ and the output code $c_{totoal}$ are binary signals and will be narrated later on.

Specifically, the positive DA converting unit 14a comprises positive DA converting capacitors $C_{a0}$-$C_{aK}$, DA converting switches $SV_{a0}$-$SV_{aK}$ and DA converting switches $SG_{a0}$-$SG_{aK}$. The positive DA converting capacitors $C_{a0}$-$C_{aK}$ are all coupled to the integrating input terminal. First terminals of the DA converting switch $SV_{ak}$ and the DA converting switch $SG_{ak}$ are coupled to the positive DA converting capacitors $C_{ak}$ (for k=0, . . . , K). A second terminal of the DA converting switch $SV_{ak}$ receives the positive voltage $V_{DD}$, and a second terminal of the DA converting switch $SG_{ak}$ is coupled to a ground terminal GND. Similarly, the negative DA converting unit 14b comprises negative DA converting capacitors $C_{b0}$-$C_{bK}$, DA converting switches $SV_{b0}$-$SV_{bK}$ and DA converting switches $SG_{b0}$-$SG_{bK}$. The negative DA converting capacitors $C_{b0}$-$C_{bK}$ are all coupled to the integrating input terminal. First terminals of the DA converting switch $SV_{bk}$ and the DA converting switch $SG_{bak}$ are coupled to the positive DA converting capacitor $C_{bk}$ (for k=0, . . . , K). A second terminal of the DA converting switch $SV_{bk}$ receives the positive voltage $V_{DD}$, and a second terminal of the DA converting switch $SG_{bk}$ is coupled to a ground terminal GND. The DA converting switches $SV_{a0}$-$SV_{aK}$, the DA converting switches $SG_{a0}$-$SG_{aK}$, the DA converting switches $SV_{b0}$-$SV_{bK}$ and the DA converting switches $SG_{b0}$-$SG_{bK}$ are controlled by the control circuit 16. In other words, the control circuit 16 may generate the plurality of control signals according to the comparing result q, to control the positive DA converting unit 14a and the negative DA converting unit 14b.

To illustrate conveniently, the positive DA converting capacitors $C_{a0}$-$C_{aK}$ (or the negative DA converting capacitors $C_{b0}$-$C_{bK}$) are arranged in a descending order according to the capacitances thereof (i.e., $C_{a0} \geq C_{a1} \geq \ldots \geq C_{aK}$ or $C_{b0} \geq C_{b1} \geq \ldots \geq C_{bK}$). In an embodiment, the capacitances of the positive DA converting capacitors $C_{a0}$-$C_{aK}$ (or the negative DA converting capacitors $C_{b0}$-$C_{bK}$) may decrease exponentially. For example, when the capacitance of the positive DA converting capacitor $C_{a0}$ is $C_A$, the capacitance of the positive DA converting capacitor $C_{ak}$ is $C_A/2^k$ (for k=0, . . . , K). Similarly, when the capacitance of the negative DA converting capacitor $C_{b0}$ is $C_B$, the capacitance of the negative DA converting capacitor $C_{bk}$ is $C_B/2^k$.

Figure 2:
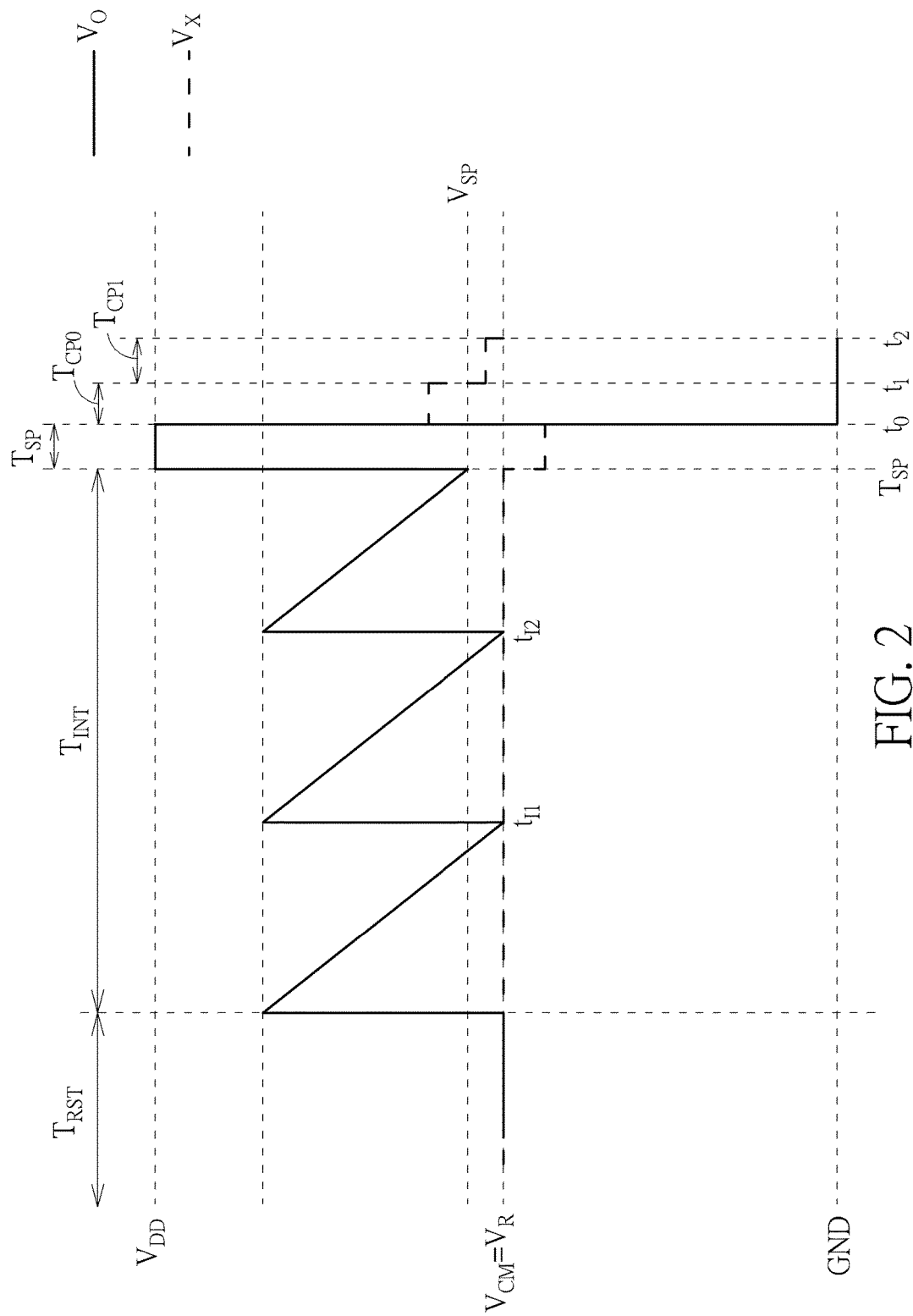
FIG. 2 is a schematic diagram of an input voltage and an output voltage according to an embodiment of the present application.

Operation details of the capacitance sensing circuit 10 are described as follows. To illustrate conveniently, FIG. 2 illustrates waveforms of the input voltage Vx and the output voltage Vo. In a reset interval $T_{RST}$, the capacitance sensing circuit 10 would clear out electronic charges stored in the integrating capacitor $C_{INT}$. In an embodiment, the switches S3, S5 and the DA converting switches $SV_{a0}$-$SV_{aK}$, $SG_{b0}$-$SG_{bK}$ are conducted (ON), and the DA converting switches $SG_{a0}$-$SG_{aK}$, $SV_{b0}$-$SV_{bK}$ are cutoff (OFF). At the same time, electronic charges in the integrating capacitor $C_{INT}$ would be cleared, and the input voltage Vx is equal to the output voltage Vo. In an embodiment, the input voltage Vx, the output voltage Vo and the reference voltage $V_R$ may be equal to the common mode voltage $V_{CM}$.

In the integrating interval $T_{INT}$, the integrating circuit 12 performs an integrating operation on the electronic charges stored in the touch capacitance Cf. In an embodiment, the switch S5 and the DA converting switches $SV_{b0}$-$SV_{bK}$, $SG_{b0}$-$SG_{bK}$ may be cutoff. The switches S1 and S3 may be controlled by a clock signal CK1, and the switches S2 and S5 may be controlled by a clock signal CK2, where the clock signal CK1 is high within a first half cycle of a clock cycle, and the clock signal CK2 is high within a second half cycle of the clock cycle. In this case, in the first half cycle, the switch S1 is conducted and the switch S2 is cutoff, and the touch capacitance Cf is charged up to the positive voltage $V_{DD}$. In the second half cycle, the switch S1 is cutoff and the switch S2 is conducted, the electronic charges stored in the touch capacitance Cf would flow to the integrating capacitor $C_{INT}$. In other words, in the integrating interval $T_{INT}$, the output voltage Vo would decrease with time. In addition, when the output voltage Vo is less than the reference voltage $V_R$, the comparator Comp would transit its state, the control circuit 16 generates the control signals to control the DA converting switches $SV_{a0}$-$SV_{aK}$ and $SG_{a0}$-$SG_{aK}$, such that the output voltage Vo is increased by a specific voltage $V_K$ (i.e., the output voltage Vo is increased to a voltage $V_R+V_K$). Hence, the value of the output voltage Vo would be limited between the voltage $V_R+V_K$ and the voltage $V_R$.

Furthermore, the logic circuit 18 may accumulate/count an accumulated transition count $N_{CNT}$ of the comparator Comp, and generate the first code $c_1$ related to the accumulated transition count $N_{CNT}$. Take the embodiment illustrated in FIG. 2 as an example, in the integrating interval $T_{INT}$, the output voltage Vo is less than the reference voltage $V_R$ at time instants $t_{t1}$, $t_{t2}$, at which the comparator Comp transits state. Hence, the accumulated transition count $N_{CNT}$ is equal to 2, and the logic circuit 18 generates the first code $c_1$ as binary representation of the accumulated transition count $N_{CNT}$, i.e., the logic circuit 18 generates the first code $c_1$ as 10. In addition, at a time instant $t_{SP}$ which the integrating interval $T_{INT}$ ends, the output voltage Vo has a sampled voltage $V_{SP}$.

Details of the control circuit 16 controlling the DA converting switches $SV_{a0}$-$SV_{aK}$ and $SG_{a0}$-$SG_{aK}$ such that the output voltage Vo is increased by the specific voltage $V_K$ are described as follows. During the next cycle when the output voltage Vo decreases to be less than the reference voltage $V_R$, the control circuit 16 controls the DA converting switches $SV_{a0}$-$SV_{aK}$ to be conducted during the first half cycle and to be cutoff during the second half cycle of the clock cycle, and the control circuit 16 controls the DA converting switches $SG_{a0}$-$SG_{aK}$ to be cutoff during the first half cycle and to be conducted during the second half cycle of the clock cycle. That is, at the time instant when the output voltage Vo decreases (because of integration) to be less than the reference voltage $V_R$ (i.e., at the clock cycle T'), the output voltage Vo may be increased to the voltage $V_R + V_K$. Therefore, the output voltage Vo would be limited between the voltage $V_R + V_K$ and the voltage $V_R$.

In addition, in a sampling interval $T_{SP}$, the capacitance sensing circuit 10 performs a sampling operation. In an embodiment, the DA converting switches $SV_{a0}$-$SV_{aK}$, the DA converting switches $SG_{b0}$-$SG_{bK}$ and the switch S4 may be conducted, the DA converting switches $SG_{a0}$-$SG_{aK}$, the DA converting switches $SV_{b0}$-$SV_{bK}$ and the switches S3, S5 may be cutoff. In this case, the integrating capacitor $C_{INT}$ may share electronic charges with the positive DA converting capacitors $C_{a0}$-$C_{aK}$ and the negative DA converting capacitors $C_{b0}$-$C_{bK}$ (i.e., charge sharing), such that the input voltage Vx would be deceased or increased during the sampling interval $T_{SP}$, and the output voltage Vo would be increased or decreased accordingly. Hence, the comparator Comp may generate the comparing result q as $q_{SP}$ (where $q_{SP}$ is also binary) corresponding to the sampling interval $T_{SP}$. The logic circuit 18 may generate a most significant bit (MSB) of the second code $c_2$ to be $q_{SP}'$, where $q_{SP}'$ represents an inverse of $q_{SP}$, i.e., $q_{SP}'$ is NOT $q_{SP}$ in Boolean algebra/logic expression.

Take the embodiment illustrated in FIG. 2 as an example, in the sampling interval $T_{SP}$, the input voltage Vx would decrease because of charge sharing (i.e., the input voltage Vx would be less than the common mode voltage $V_{CM}$). Since the amplifier Amp would invertingly amplify its input, a slight decrease of the input voltage Vx would cause the output voltage Vo to go high rapidly (e.g., the output voltage Vo would become high rapidly and be up to a saturation voltage of the amplifier Amp, where the saturation voltage of the amplifier Amp may be the positive voltage $V_{DD}$). Hence, the comparator Comp generates the comparing result $q_{SP}$ as 1 (i.e., $q_{SP}=1$), and the logic circuit 18 generates the MSB of the second code $c_2$ as 0 according to $q_{SP}$ (i.e., $q_{SP}'=0$ since $q_{SP}=1$).

In addition, in the comparing interval $T_{CP}$, the control circuit 16 controls the DA converting switches $SV_{a0}$-$SV_{aK}$, $SG_{a0}$-$SG_{aK}$, $SV_{b0}$-$SV_{bK}$, $SG_{b0}$-$SG_{bK}$, to adjust the input voltage Vx to approach the common mode voltage $V_{CM}$. Specifically, the comparing interval $T_{CP}$ may be divided into the comparing subintervals $T_{CP0}$-$T_{CPK}$. In the comparing subinterval $T_{CP0}$, the control circuit 16 controls the DA converting switches $SV_{a0}$, $SG_{a0}$, $SV_{b0}$, $SG_{b0}$ according to the comparing result $q_{SP}$, such that the input voltage Vx is able to be increased/decreased, and the output voltage Vo is able to be decreased/increased in the comparing subinterval $T_{CP0}$. The comparator Comp generates the comparing result q as $q_0$ (where $q_0$ is binary) corresponding to the comparing subinterval $T_{CP0}$. At the same time, the logic circuit 18 generates a second significant bit of the second code $c_2$ as $q_0'$ according to $q_{SP}$. Similarly, $q_0'$ represents an inverse of $q_0$, i.e., $q_0'$ is NOT $q_0$ in Boolean expression. Moreover, the second significant bit of the second code $c_2$ represents the next bit from the right of MSB of the second code $c_2$ (where the right is the direction from the MSB to the least significant bit (LSB)). Take the embodiment illustrated in FIG. 2 as an example, in the comparing subinterval $T_{CP0}$, the control circuit 16 controls the DA converting switches $SV_{a0}$, $SG_{a0}$, $SV_{b0}$, $SG_{b0}$ according to the comparing result $q_{SP}$, such that the input voltage Vx is able to be increased in the comparing subinterval $T_{CP0}$, the output voltage Vo is able to be decreased in the comparing subinterval $T_{CP0}$, and the comparator Comp generates the comparing result $q_0$ as 0 (i.e., $q_0=0$). At the same time, the logic circuit 18 generates the second significant bit of the second code $c_2$ as 1 according to $q_0$ (i.e., $q_0'=1$, since $q_0=0$).

In addition, in a comparing subinterval $T_{CPk}$ of the comparing subintervals $T_{CP1}$-$T_{CPK}$ the control circuit 16 controls the DA converting switches $SV_{ak}$, $SG_{ak}$, $SV_{bk}$, $SG_{bk}$ according to the comparing result $q_{k-1}$, such that the input voltage Vx is able to be increased/decreased, the output voltage Vo is able to be decreased/increased in the comparing subinterval $T_{CPk}$, and the comparator Comp generates the comparing result q as $q_k$ (where $q_k$ is also binary) corresponding to the comparing subinterval $T_{CPk}$. At the same time, the logic circuit 18 generates the next k+1 bit from the right of MSB of the second code $c_2$ as $q_k'$ according to the comparing result $q_k$. Similarly, $q_k'$ represents an inverse of $q_k$, i.e., $q_k'$ is NOT $q_k$ in Boolean expression (where the right is the direction from the MSB to the least significant bit). Therefore, at a time instant which the comparing interval $T_{CP}$ ends, the logic circuit 18 may generate the second code $c_2$ as $q_{SP}'$ $q_0'$ $q_2'$ . . . $q_K'$.

Take the embodiment illustrated in FIG. 2 as an example, in the comparing subinterval $T_{CP1}$, the control circuit 16 controls the DA converting switches $SV_{a1}$, $SG_{a1}$, $SV_{b1}$, $SG_{b1}$ according to the comparing result $q_0$, such that the input voltage Vx is able to be decreased in the comparing subinterval, the output voltage Vo is able to be increased in the comparing subinterval $T_{CP0}$, the comparator Comp generates the comparing result $q_1$ as 1 (i.e., $q_1=1$). At the same time, the logic circuit 18 generates the next 2 bit from the right of MSB of the second code $c_2$ as 0 according to $q_1$ (i.e., $q_1'=0$, since $q_1=1$). At a time instant which the comparing interval $T_{CP}$ ends, the logic circuit 18 generates the second code $c_2$ as 010.

Figure 3:
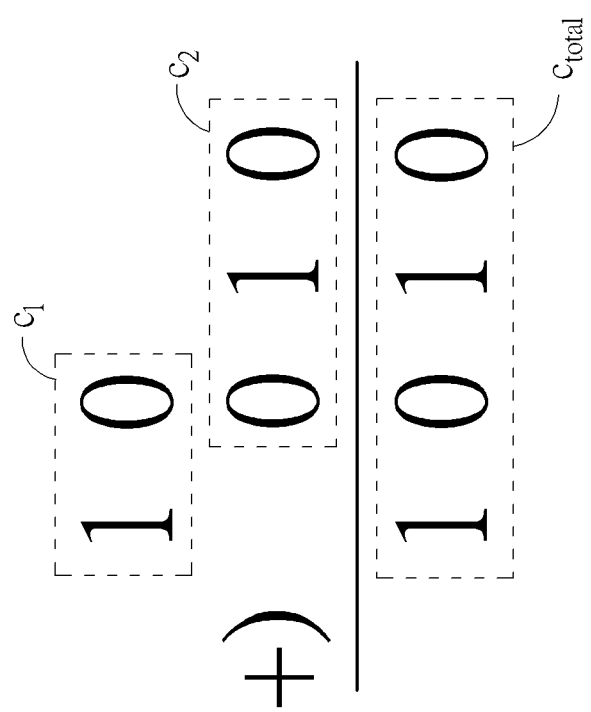
FIG. 3 is a schematic diagram of a first code, a second code and an output code according to an embodiment of the present application.

In addition, after the logic circuit 18 generates the first code $c_1$ and the second code $c_2$, the logic circuit 18 may generate the output code $c_{totoal}$ related to the capacitance of the touch capacitance Cf according to the first code $c_1$ and the second code $c_2$. Specifically, in a case that the second code $c_2$ comprises N bits, the logic circuit 18 may multiply the binary value, which the first code $c_1$ represents, by $2^{N-1}$ (which is equivalent to shifting the first code $c_1$ (N−1) bits left), and add the multiplication result (i.e., the shifted result) with the second code $c_2$. The additive result is the output code $c_{totoal}$. At the same time, the binary value which the output code $c_{totoal}$ represents is related to the capacitance of the touch capacitance Cf. Moreover, the first code $c_1$ can be regarded as a coarse code, which comprises a more significant part of the output code $c_{totoal}$; and the second code $c_2$ can be regarded as a fine code, which comprises a less significant part of the output code $c_{totoal}$. Take the embodiment illustrated in FIG. 2 as an example, the logic circuit 18 may generate the output code $c_{totoal}$ as an additive result of the second code $c_2$ plus a shifted version of the first code $c_1$, where the shifted version of the first code $c_1$ is a result of left shifting the first code $c_1$ by 2 bits, as shown in FIG. 3.

In another perspective, in the comparing subinterval $T_{CPk}$, an increase amount of the input voltage Vx is related to the capacitance of the positive DA converting capacitor $C_{ak}$ which the DA converting switches $SV_{ak}$, $SG_{ak}$ correspond to. In the comparing subinterval $T_{CPk}$, a decrease amount of the input voltage Vx is related to the capacitance of the negative DA converting capacitor $C_{bk}$ which the DA converting switches $SV_{bk}$, $SG_{bk}$ correspond to. In a condition that the positive DA converting capacitors $C_{a0}$-$C_{aK}$ (or the negative DA converting capacitors $C_{b0}$-$C_{bK}$) are arranged in the descending order according to the capacitances thereof, within the comparing subintervals $T_{CP1}$-$T_{CPK}$, the increase/decrease amount of the input voltage Vx would be decreased when k increases, and a difference between the input voltage Vx and the sampled voltage $V_{SP}$ also decrease as k increases. In other words, the control circuit 16 adjusts the input voltage Vx in the comparing subinterval $T_{CPk}$, by controlling the DA converting switches $SV_{ak}$, $SG_{ak}$, $SV_{bk}$, $SG_{bk}$, so as to approach the common mode voltage $V_{CM}$. In addition, the logic circuit 18 may generate the second code $c_2$ (i.e., the fine code) according to the comparing result q generated by the comparator Comp in the sampling interval $T_{SP}$ and the comparing interval $T_{CP}$, and generate the output code $c_{totoal}$ according to the first code $c_1$ and the second code $c_2$. Therefore, the digital output code $c_{totoal}$ may represent the capacitance of the touch capacitance Cf.

In addition, operation details of the positive DA converting unit 14a, the negative DA converting unit 14b, the control circuit 16 and the logic circuit 18 during the sampling interval $T_{SP}$ and the comparing interval $T_{CP}$ are similar to a successive approximation register analog-to-digital converter (as known as SAR ADC). The SAR ADC is known by the art, which is not narrated herein for brevity.

As can be seen, the present application utilizes the control circuit 16 to control the positive DA converting unit 14a and the negative DA converting unit 14b in the comparing interval $T_{CP}$ to adjust the input voltage Vx so as to approach the common mode voltage $V_{CM}$. In addition, in the sampling interval $T_{SP}$ and the comparing interval $T_{CP}$, the comparing result q generated by the comparator Comp is configured to generate the second code $c_2$ (i.e., the fine code). Therefore, the output code $c_{totoal}$ generated according to the first code $c_1$ and the second code $c_2$, as the digital signal, represents the capacitance of the touch capacitance Cf. Compared to the prior art, the capacitance sensing circuit 10 needs no analog to digital convertor (ADC), and is able to accurately convert the capacitance of the touch capacitance Cf into digital signals. In addition to the advantages of simple circuit, small circuit area, low cost and low power consumption, the capacitance sensing circuit 10 further reduces the required latency of the sampling interval $T_{SP}$ and the comparing interval $T_{CP}$.

Figure 4:
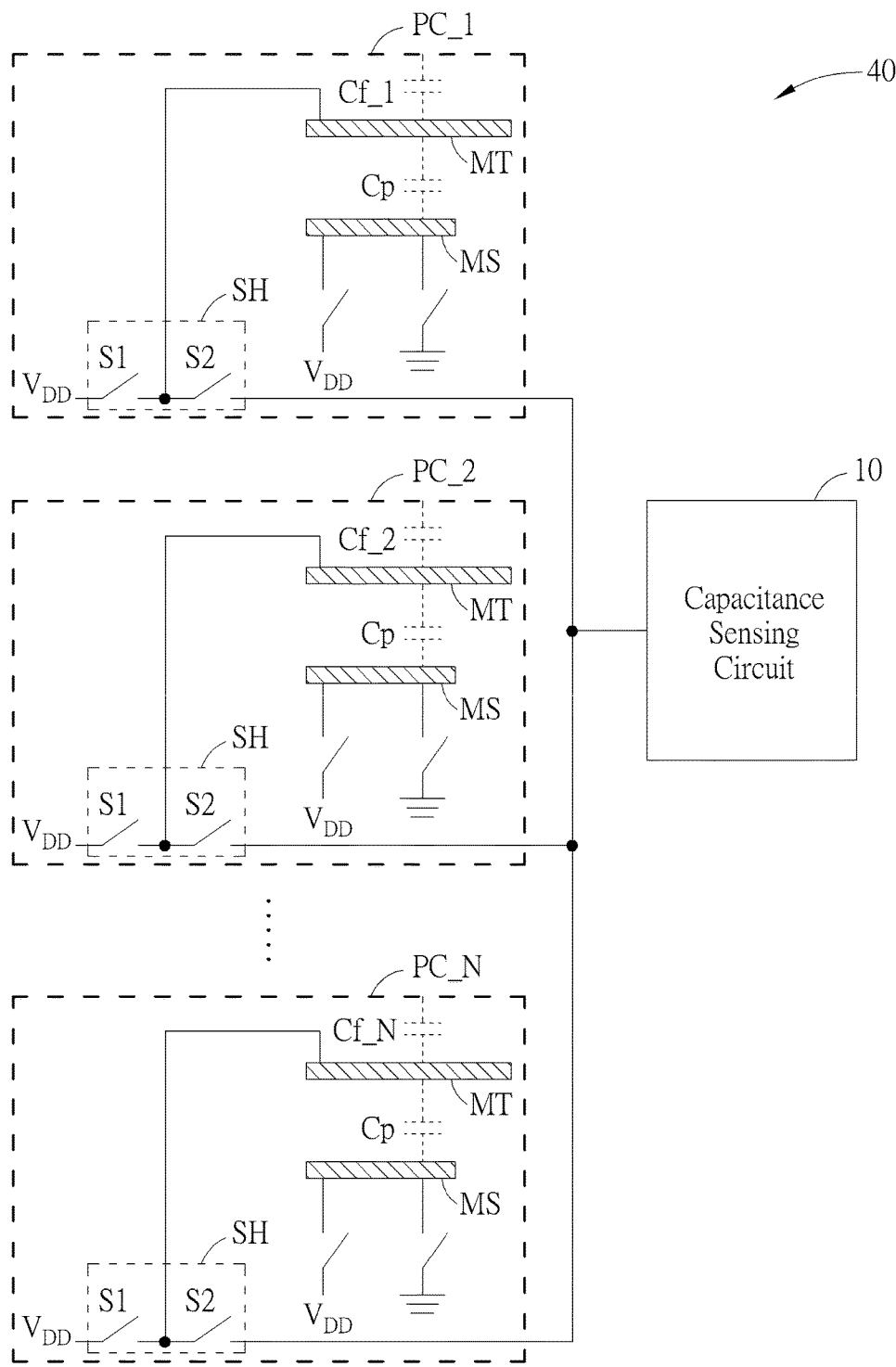
FIG. 4 is a schematic diagram of a fingerprint identification system according to an embodiment of the present application.

In addition, the capacitance sensing circuit 10 may be applied in a fingerprint identification system. Please refer to FIG. 4. FIG. 4 is a schematic diagram of a fingerprint identification system 40 according to an embodiment of the present application. The fingerprint identification system 40 comprises pixel circuits PC_1-PC_N and the capacitance sensing circuit 10. The pixel circuits PC_1-PC_N form the touch capacitances Cf_1-Cf_N with a finger of a user, and the capacitance sensing circuit 10 may be coupled to the sample-and-hold circuit SH comprised in the pixel circuits PC_1-PC_N (where the connection between the capacitance sensing circuit 10 and the sample-and-hold circuit SH is the same as FIG. 1), so as to measure the capacitances of the touch capacitances Cf_1-Cf_N. Therefore, the fingerprint identification system 40 may determine locations of the pixel circuits PC_1-PC_N are finger ridge or finger valley according to the capacitances of the touch capacitances Cf_1-Cf_N. In addition, the circuit structure of the pixel circuits is not limited. For example, each pixel circuit may comprise a top metal MT and a shielding layer MS. The top metal MT is configured to receive touch from the finger of the user, and forms the touch capacitance with the user's finger, and a parasitic capacitance Cp may be formed between the top metal MT and the shielding layer MS.

Notably, the embodiments stated in the above are utilized for illustrating the concept of the present application. Those skilled in the art may make modifications and alterations accordingly, and not limited herein. For example, the first code $c_1$ and the second code $c_2$ not limited in length (bit number). That is, the length (number of bits) of the first code $c_1$ and the second code $c_2$ may be changed according to practical requirement. For example, the first code $c_1$ may have 10 bits, the second code $c_2$ may have 3 bits, and the output code $c_{totoal}$ may have 12 bits.

In summary, the capacitance sensing circuit of the present application utilizes the positive DA converting unit and the negative DA converting unit to adjust the input voltage to approach the common mode voltage in the sampling interval and the comparing interval, and the comparing results generated by the comparator during the sampling interval and the comparing interval are configured to generate the fine code. Compared to the prior art, the capacitance sensing circuit of the present application has the advantages of simple circuit, small circuit area, low cost, low power consumption and low latency.

The foregoing is only embodiments of the present application, which is not intended to limit the present application. Any modification following the spirit and principle of the present application, equivalent substitutions, improvements should be included within the scope of the present invention.

What is claimed is:

1. A capacitance sensing circuit, configured to sense a touch capacitance, the capacitance sensing circuit comprising:
   an integrating circuit, comprising:
      an integrating input terminal, coupled to the touch capacitance, wherein the integrating input terminal receives an input voltage; and
      an integrating output terminal, configured to output an output voltage;
   a comparator, comprising:
      a first input terminal, coupled to the integrating output terminal; and
      a second input terminal, configured to receive a reference voltage;
   a positive digital-to-analog (DA) converting unit, coupled to the integrating input terminal;
   a negative DA converting unit, coupled to the integrating input terminal;
   a control circuit, coupled to a comparing output terminal of the comparator, configured to control the positive DA converting unit and the negative DA converting unit; and
   a logic circuit, coupled to the comparing output terminal, configured to generate a first code within an integrating interval and generate a second code within a comparing interval, wherein the logic circuit outputs an output code according to the first code and the second code, and the output code is related to a capacitance of the touch capacitance.

2. The capacitance sensing circuit as claim 1, wherein the positive DA converting unit comprises:

a plurality of positive DA converting capacitors, all coupled to the integrating input terminal;

a plurality of first DA converting switches, wherein a terminal of each first DA converting switch is coupled to the plurality of positive DA converting capacitors, and the other terminal of each first DA converting switch is configured to receive a positive voltage; and a plurality of second DA converting switches, wherein a terminal of each second DA converting switch is coupled to the plurality of positive DA converting capacitors, and the other terminal of each second DA converting switch is coupled to a ground terminal; and the negative DA converting unit comprises:

a plurality of negative DA converting capacitors, coupled to the integrating input terminal;

a plurality of third DA converting switches, wherein a terminal of each third DA converting switch is coupled to the plurality of negative DA converting capacitors, and the other terminal of each third DA converting switch receives the positive voltage; and a plurality of fourth DA converting switches, wherein a terminal of each fourth DA converting switch is coupled to the plurality of negative DA converting capacitors, and the other terminal of each fourth DA converting switch is coupled to the ground terminal;

wherein the plurality of first DA converting switches, the plurality of second DA converting switches, the plurality of third DA converting switches and the plurality of fourth DA converting switches are controlled by the control circuit.

3. The capacitance sensing circuit as claim 2, wherein capacitances of the plurality of positive DA converting capacitors have an exponential relationship in between, and capacitances of the plurality of negative DA converting capacitors have an exponential relationship in between.

4. The capacitance sensing circuit as claim 2, wherein the control circuit controls the first DA converting switches and the second DA converting switches of the positive DA converting unit in the integrating interval, such that when the comparator transition happens, the output voltage is added by a first specific value.

5. The capacitance sensing circuit as claim 2, wherein the logic circuit counts an accumulated transition count of the comparator in the integrating interval, and generated the first code related to the accumulated transition count.

6. The capacitance sensing circuit as claim 2, wherein the control circuit controls the first DA converting switches and the second DA converting switches of the positive DA converting unit in a sampling interval, such that the plurality of positive DA converting capacitors receive the positive voltage; and the control circuit controls the third DA converting switches and the fourth DA converting switches of the negative DA converting unit in the sampling interval, such that the plurality of negative DA converting capacitors are coupled to the ground terminal.

7. The capacitance sensing circuit as claim 2, wherein the control circuit controls the plurality of first DA converting switches, the plurality of second DA converting switches, the plurality of third DA converting switches and the plurality of fourth DA converting switches in the comparing interval, so as to adjust the input voltage.

8. The capacitance sensing circuit as claim 7, wherein the comparing interval comprises a plurality of comparing subintervals, and within one of the plurality of comparing subintervals, the comparator generates a comparing result corresponding to the comparing subinterval.

9. The capacitance sensing circuit as claim 8, wherein the logic circuit generates the second code according to a plurality of comparing results corresponding to the plurality of comparing subintervals.

10. The capacitance sensing circuit as claim 8, wherein in the comparing subinterval, when the comparing result indicates that the input voltage is greater than a common mode voltage, the control circuit controls the plurality of first DA converting switches, the plurality of second DA converting switches, the plurality of third DA converting switches and the plurality of fourth DA converting switches, such that the input voltage is decreased by a second specific value in the next comparing subinterval.

11. The capacitance sensing circuit as claim 8, wherein in the comparing subinterval, when the comparing result indicates that the input voltage is less than a common mode voltage, the control circuit controls the plurality of first DA converting switches, the plurality of second DA converting switches, the plurality of third DA converting switches and the plurality of fourth DA converting switches, such that the input voltage is increased by a third specific value in the next comparing subinterval.

12. The capacitance sensing circuit as claim 1, wherein the output code is the second code plus a shifted version of the first code, and the shifted version is a result of left shifting of the first code by (N−1) bits, and N represents number of bits within the second code.

13. The capacitance sensing circuit as claim 1, further comprising a sample-and-hold circuit, coupled to the touch capacitance and the integrating input terminal.

14. The capacitance sensing circuit as claim 13, wherein the sample-and-hold circuit comprises:

a first switch, wherein a terminal of the first switch is configured to receive a positive voltage, and the other terminal of the first switch is coupled to the touch capacitance; and a second switch, wherein a terminal of the second switch is coupled to the touch capacitance, the other terminal of the second switch is coupled to the integrating input terminal;

wherein the first switch is conducted and the second switch is cutoff within a first time, while the first switch is cutoff and the second switch is conducted within a second time.

15. The capacitance sensing circuit as claim 1, wherein the integrating circuit comprises:

an amplifier, coupled between the integrating input terminal and the integrating output terminal;

an integrating capacitor, coupled to the integrating input terminal;

a third switch, coupled to the integrating capacitor and the integrating output terminal; and a fourth switch, wherein a terminal of the fourth switch is coupled to the integrating capacitor and the third switch, and the other terminal of the fourth switch is configured to receive a common mode voltage.

16. The capacitance sensing circuit as claim 15, wherein the reference voltage is equal to the common mode voltage.

17. The capacitance sensing circuit as claim 1, wherein the integrating circuit further comprises:

a fifth switch, coupled between the integrating input terminal and the integrating output terminal.

18. A fingerprint identification system, comprising:

a plurality of pixel circuits, configured to form a plurality of touch capacitances with a finger; and a capacitance sensing circuit, coupled to the plurality of pixel circuits, configured to sense the plurality of touch capacitances, the capacitance sensing circuit comprising:
  an integrating circuit, comprising:
    an integrating input terminal, wherein the integrating input terminal is configured to receive an input voltage; and
    an integrating output terminal, configured to output an output voltage;
  a comparator, comprising:
    a first input terminal, coupled to the integrating output terminal; and
    a second input terminal, configured to receive a reference voltage;
  a positive DA converting unit, coupled to the integrating input terminal;
  a negative DA converting unit, coupled to the integrating input terminal;
  a control circuit, coupled to a comparing output terminal of the comparator, configured to control the positive DA converting unit and the negative DA converting unit; and
  a logic circuit, coupled to the comparing output terminal, configured to generate a first code within an integrating interval and generate a second code within a comparing interval, wherein the logic circuit outputs an output code according to the first code and the second code, and the output code is related to a touch capacitance of the plurality of touch capacitances.

\* \* \* \* \*